(12) United States Patent
Mazraehno

(10) Patent No.: US 12,170,342 B2
(45) Date of Patent: Dec. 17, 2024

(54) OPTOELECTRONIC SEMICONDUCTOR COMPONENT HAVING AN INTERMEDIATE LAYER AND METHOD FOR PRODUCING THE OPTOELECTRONIC SEMICONDUCTOR COMPONENT

(71) Applicant: OSRAM Opto Semiconductors GmbH, Regensburg (DE)

(72) Inventor: Mohammad Tollabi Mazraehno, Jena (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 739 days.

(21) Appl. No.: 17/413,393

(22) PCT Filed: Dec. 18, 2019

(86) PCT No.: PCT/EP2019/085859
§ 371 (c)(1),
(2) Date: Jun. 11, 2021

(87) PCT Pub. No.: WO2020/127429
PCT Pub. Date: Jun. 25, 2020

(65) Prior Publication Data
US 2022/0029053 A1 Jan. 27, 2022

(30) Foreign Application Priority Data
Dec. 21, 2018 (DE) .......................... 102018133526.1

(51) Int. Cl.
*H01L 33/06* (2010.01)
*H01L 33/00* (2010.01)
(Continued)

(52) U.S. Cl.
CPC ............ *H01L 33/06* (2013.01); *H01L 33/007* (2013.01); *H01L 33/12* (2013.01); *H01L 33/32* (2013.01)

(58) Field of Classification Search
CPC ....... H01L 33/06; H01L 33/007; H01L 33/12; H01L 33/32; H01L 33/14
See application file for complete search history.

(56) References Cited

U.S. PATENT DOCUMENTS

2012/0113658 A1* 5/2012 Sakai .................... H01L 33/007
362/458
2014/0138617 A1 5/2014 Lai et al.
(Continued)

FOREIGN PATENT DOCUMENTS

| CA | 2322490 A1 | 9/1999 |
|----|------------|--------|
| CN | 107546305 A | 1/2018 |
| EP | 2270879 A1 | 1/2011 |

OTHER PUBLICATIONS

Shatalov M., et al., "AlGaN Deep-Ultraviolet Light-Emitting Diodes with External Quantum Efficiency above 10%," Applied Physics Express, vol. 5, Jul. 11, 2012, pp. 082101-1-082101-3.
(Continued)

*Primary Examiner* — Su C Kim
(74) *Attorney, Agent, or Firm* — Slater Matsil, LLP

(57) ABSTRACT

In an embodiment an optoelectronic semiconductor component includes a first semiconductor layer of an n-conductivity type, the first semiconductor layer being of $Al_xGa_{1-x}N$ composition, with $0.3 \le x \le 0.95$, a second semiconductor layer of a p-conductivity type, an active zone between the first semiconductor layer and the second semiconductor layer, the active zone including a quantum well structure and an intermediate layer between the first semiconductor layer and the active zone, wherein the intermediate layer includes a semiconductor material of $Al_yGa_{1-y}N$ composition, with
(Continued)

$x \cdot 1.05 \leq y \leq 1$, and wherein the intermediate layer is located directly adjacent to the active zone.

13 Claims, 9 Drawing Sheets

(51) Int. Cl.
*H01L 33/12* (2010.01)
*H01L 33/32* (2010.01)

(56) References Cited

U.S. PATENT DOCUMENTS

2016/0021864 A1* 1/2016 Koo .................. A01M 1/106 43/113
2017/0084779 A1 3/2017 Moe et al.
2018/0346348 A1 12/2018 Collins et al.

OTHER PUBLICATIONS

Jo M., et al., "Enhanced light extraction in 260 nm light-emitting diode with a highly transparent p-AlGaN layer," Applied Physics Express, vol. 9, Dec. 4, 2015, pp. 012102-1-012102-3.

Takano T., et al., "Deep-ultraviolet light-emitting diodes with external quantum efficiency higher than 20% at 275 nm achieved by improving light-extraction efficiency," Applied Physics Express, vol. 10, Feb. 14, 2017, pp. 031002-1-031002-4.

Ichikawa M., et al., "High-output-power deep ultraviolet light-emitting diode assembly using direct bonding", Applied Physics Express, vol. 9, Jun. 1, 2016, pp. 072101-1-072101-4.

Cheng B., et al., "Enhanced vertical and lateral hole transport in high aluminum-containing AlGaN for deep ultraviolet light emitters," Applied Physics Letters, vol. 102, Jun. 10, 2013, pp. 231106-1-231106-4.

Liu D., et al., "229 nm UV LEDs on aluminum nitride single crystal substrates using p-type silicon for increased hole injection," Applied Physics Letters, vol. 112, Feb. 20, 2018, pp. 081101-1-081101-4.

Jmerik, V. N. et al., "Plasma-assisted molecular beam epitaxy of AlGaN heterostructures for deep ultraviolet optically pumped lasers", Physica Status Solidi A, vol. 210, Mar. 4, 2013, pp. 439-450.

Fellmann, V. et al., "Ternary AlGaN Alloys with High Al Content and Enhanced Compositional Homogeneity Grown by Plasma-Assisted Molecular Beam Epitaxy," Japanese Journal of Applied Physics, vol. 50, Mar. 22, 2011, pp. 031001-1-031001-7.

Shih, Ya-Hsuan et al., "Design of Hole-Blocking and Electron-Blocking Layers in AxGa1-xN-based UV Light-Emitting Diodes," IEEE Transactions on Electron Devices, vol. 63, Feb. 5, 2016, pp. 1141-1147.

Chiaria S. et al., "Design Criteria for Near-Ultarviolet GaN-based Light-emitting Diodes," IEEE Transactions on Electron Devices, vol. 57, Dec. 4, 2009, pp. 60-70.

Yi, X. et al., "Special AlGaN graded superlattice hole and electron blocking layers improved performance of AlGaN-based ultraviolet light-emitting diodes," Optics and Laser Technology, vol. 106, May 16, 2018, pp. 469-473.

* cited by examiner

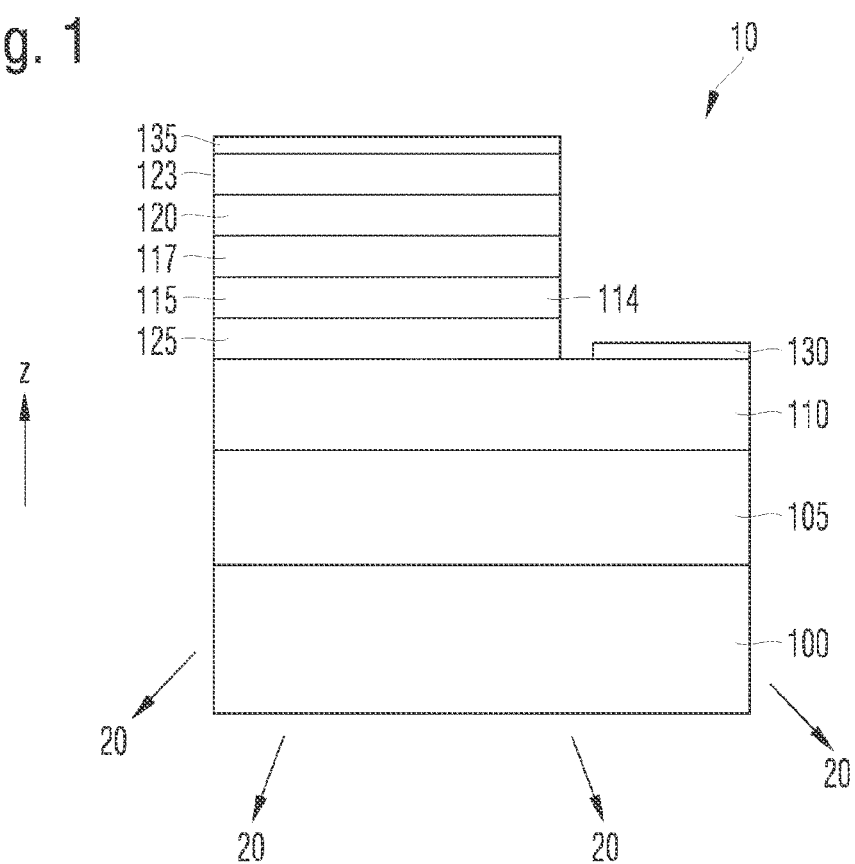

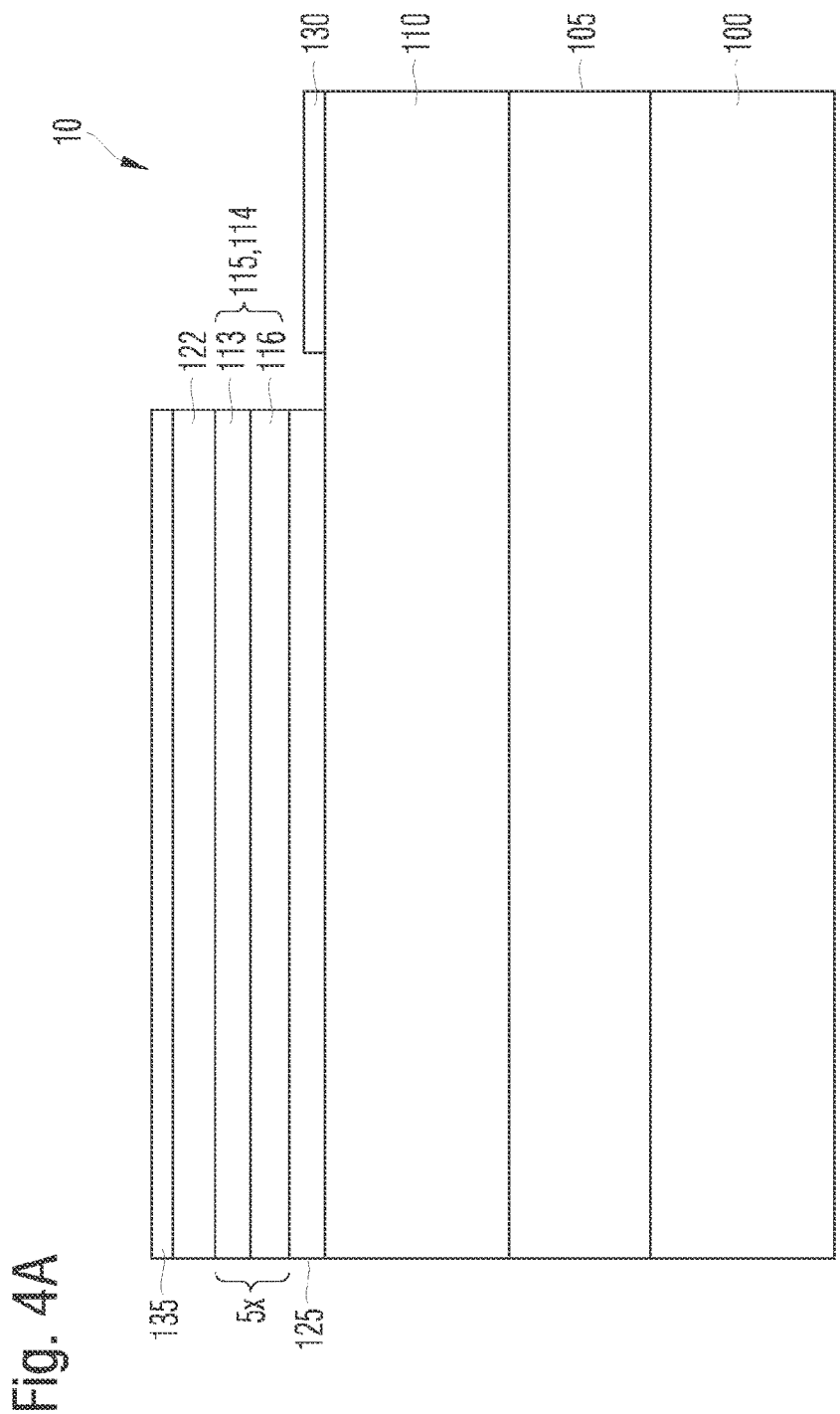

OPTOELECTRONIC SEMICONDUCTOR COMPONENT HAVING AN INTERMEDIATE LAYER AND METHOD FOR PRODUCING THE OPTOELECTRONIC SEMICONDUCTOR COMPONENT

This patent application is a national phase filing under section 371 of PCT/EP2019/085859, filed Dec. 18, 2019, which claims the priority of German patent application 10 2018 133 526.1, filed Dec. 21, 2018, each of which is incorporated herein by reference in its entirety.

BACKGROUND

A light emitting diode (LED) is a light emitting device based on semiconductor materials. For example, light-emitting diodes based on the AlGaN material system are used to provide light sources in the deep ultraviolet (DUV) range. In general, efforts are being made to increase the efficiency of light-emitting diodes based on the AlGaN material system.

SUMMARY

Embodiments provide an improved optoelectronic semiconductor component and an improved method for producing an optoelectronic semiconductor component.

An optoelectronic semiconductor component comprises a first semiconductor layer of a first conductivity type, the first semiconductor layer being of $Al_xGa_{1-x}N$ composition. The optoelectronic semiconductor component further comprises a second semiconductor layer of a second conductivity type, an active zone between the first semiconductor layer and the second semiconductor layer, the active zone comprising a quantum well structure, and an intermediate layer between the first semiconductor layer and the active zone. The intermediate layer comprises a semiconductor material of $Al_yGa_{1-y}N$ composition, with $x*1.05 \leq y \leq 1$.

For example, the intermediate layer has a layer thickness greater than 2 nm, greater than 8 nm or greater than 40 nm. The layer thickness of the intermediate layer may be less than 100 nm.

For example, the intermediate layer is undoped. According to further embodiments, the intermediate layer may be of the first conductivity type.

For example, the intermediate layer may comprise a layer stack comprising first sub-layers and second sub-layers alternately stacked one on top of the other. The first sub-layers are of $Al_{y'}Ga_{1-y'}N$ composition ($0 \leq y' \leq 1$) having a layer thickness d'. The second sub-layers are of $Al_{y''}Ga_{1-y''}N$ composition ($0 \leq y'' \leq y'$) and have a layer thickness d". For example, the average Al content of the intermediate layer 125 is, in this case, defined as follows:

$$y_{avg} = (y'*d' + y''*d'')/(d'+d''),$$

wherein further:

$$x*1.05 \leq y_{avg} \leq 1.$$

The layer thicknesses of the first and second sub-layers may each be greater than 1 nm and less than 10 nm. For example, the first and second sub-layers may form a superlattice. The maximum layer thickness of the superlattice may be less than 100 nm.

According to embodiments, the first semiconductor layer is of $Al_xGa_{1-x}N$ composition, with $0.3 < x < 0.95$.

The intermediate layer may be directly adjacent to the active zone.

According to embodiments, an aluminum content of the intermediate layer may increase or decrease as the distance from the active zone increases.

A method for producing an optoelectronic semiconductor component comprises forming a first semiconductor layer of a first conductivity type, the first semiconductor layer being of $Al_xGa_{1-x}N$ composition. The method further comprises forming a second semiconductor layer of a second conductivity type, forming an active zone between the first semiconductor layer and the second semiconductor layer, the active zone comprising a quantum well structure, and forming an intermediate layer between the first semiconductor layer and the active zone. The intermediate layer comprises a semiconductor material of $Al_yGa_{1-y}N$ composition, with $x*1.05 \leq y \leq 1$.

For example, the first semiconductor layer may be formed from a metal-oversaturated gas mixture.

According to embodiments, the intermediate layer may be formed from a metal-oversaturated gas mixture. In this case, a degree of metal supersaturation for the intermediate layer may be lower than that for the first semiconductor layer. For example, the degree of metal supersaturation for the growth of the intermediate layer may be at least 10% less than that for the growth of the first semiconductor layer.

An optoelectronic device comprises the optoelectronic semiconductor component as described above. The optoelectronic device may be selected from a UV disinfection device, a UV curing device or a UV measuring device.

BRIEF DESCRIPTION OF THE DRAWINGS

The accompanying drawings serve to provide an understanding of exemplary embodiments of the invention. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

FIG. 1 shows a cross-sectional view of an optoelectronic semiconductor component in accordance with embodiments;

FIG. 4A shows a cross-sectional view of an optoelectronic semiconductor component according to further embodiments;

DETAILED DESCRIPTION OF ILLUSTRATIVE EMBODIMENTS

Figure 2A:
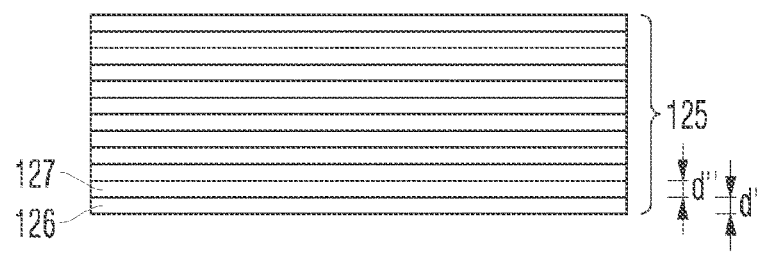
FIG. 2A shows details of an intermediate layer according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz, silicon, SiC, AlN, GaN or a ceramic.

Depending on the intended use, the semiconductor material described as part of the present description may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the semiconductor compound materials may vary. Other examples of semiconductor materials may include silicon, silicon germanium, and germanium.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical" as used in this description is intended to describe an orientation which is essentially perpendicular to the first surface of the semiconductor substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

Examples of optoelectronic semiconductor devices will be described below. In particular, light-emitting diodes will be described. However, the concepts may also be applied to other optoelectronic semiconductor components and are therefore not limited to light-emitting diodes. Further specific examples include, without limitation, semiconductor laser devices, such as surface-emitting semiconductor laser devices, photodetectors, sensors, and others.

FIG. 1 shows a schematic cross-sectional view of an opto-electronic semiconductor component in accordance with embodiments. The optoelectronic semiconductor component 10 comprises a first semiconductor layer 110 of a first conductivity type, a second semiconductor layer 120 of a second conductivity type and an active zone 115 between the first semiconductor layer no and the second semiconductor layer 120. The first semiconductor layer 110 is of $Al_xGa_{1-x}N$ composition. The active zone comprises a quantum well structure. The optoelectronic semiconductor component 10 furthermore comprises an intermediate layer 125 between the first semiconductor layer no and the active zone 115. The intermediate layer 125 comprises a semiconductor material of $Al_yGa_{1-y}N$ composition. The following applies: $x*1.05 \leq y \leq 1$. For example, the intermediate layer 125 may be n-doped with Si.

The active zone 115 comprises a quantum well structure 114 for generating radiation, for example a single quantum well structure (SQW) or a multiple quantum well structure (MQW). The term "quantum well structure" does not imply any particular meaning here with regard to the dimensionality of the quantization. Therefore it includes, among other things, quantum wells, quantum wires and quantum dots as well as any combination of these structures.

The active zone 115 may, for example, comprise sub-layers having different electrical band gaps, the corresponding sub-layers being stacked one on top of the other. For example, a material of a smaller band gap (quantum well layer 113) may be arranged between two barrier layers 116 having a larger band gap. If the layer thickness of the sub-layer having the smaller band gap is in the range of the de-Broglie wavelength of electrons, the energy states within the sub-layer having the smaller band gap are quantized and a quantum well structure is formed. Depending on the number of sub-layers having a smaller band gap in which quantized energy levels are formed, this is called an active zone having a single quantum well structure or an active zone having a multiple (MQW) quantum well structure.

One or more electron blocking layers 117, which may, for example, contain AlGaN and may be p-doped, are formed over the active zone 115. A second semiconductor layer 120 is arranged over the electron blocking layer 117. For example, the second semiconductor layer 120 is an AlGaN layer p-doped with Mg. A contact layer 123 may be arranged over the second semiconductor layer 120. For example, the contact layer 123 may be GaN p-doped with Mg. A second contact element 135 may be arranged over the contact layer 123. The layers and layer thicknesses specified here are given as examples, and other layer thicknesses or dopants may be used. Furthermore, layers may be omitted or added as long as the functionality of the optoelectronic semiconductor component 10 is not impaired.

For example, the first semiconductor layer 110 may be of an n-conductivity type and the second semiconductor layer 120 is of a p-conductivity type. For example, the first semiconductor layer no is of $Al_xGa_{1-x}N$ composition, with $0.3 \leq x \leq 0.95$. The first semiconductor layer 110 may, for example, have a layer thickness of 0.5 to 3 µm, for example approximately 1.5 µm. The first semiconductor layer no may be arranged over a transparent substrate 100, for example. For example, the substrate 100 may be a sapphire substrate. Further layers may be arranged within the semiconductor layer structure.

For example, one or more buffer layers 105 may be arranged between the substrate 100 and the first semiconductor layer no. The buffer layers 105 may, for example, comprise a plurality of $Al_xGa_{1-x}N$ layers having different compositions or composition ratios. These buffer layers may, for example, reduce the density of spiral or helical dislocations ("threading dislocations"). Furthermore, they allow strains to be adjusted. A layer thickness of the buffer layer(s) 105 may, for example, be up to 10 µm. The buffer layer 105 may also be omitted. For example, it may be omitted if a native substrate such as AlN is used as substrate 100.

The first semiconductor layer no may be electrically connected via a first contact element 130, for example. The second semiconductor layer 120 may be electrically connected via a second contact element 135, for example. By applying a suitable voltage between the first contact element 130 and the second contact element 135, electromagnetic radiation 20 may be emitted within the active zone 115, for example.

Electromagnetic radiation 20 generated in the active zone 115 may be output, for example, via a main surface 101 and also via side surfaces 102 of substrate 100. Generated electromagnetic radiation 20 might also be output via the surface of layer 135.

On average, the intermediate layer 125 comprises a higher aluminum content than the first semiconductor layer no. For example, the aluminum content of the intermediate layer 125 may be at least 5% or optionally at least 10% higher than the aluminum content of the first semiconductor layer no. For example, the intermediate layer may have a layer thickness greater than 2 nm or greater than 8 nm or even greater than 20 nm. According to further embodiments, the layer thickness of the intermediate layer 125 may be less than 100 nm. In the case of greater layer thicknesses, the electron injection may be impaired. It has been found that by interposing the intermediate layer 125 between the first semiconductor layer no and the active zone 115, the emitted power of the electromagnetic radiation may be greatly increased.

According to embodiments, the intermediate layer 125 may be undoped or doped, for example at a doping level of up to 5E19 $cm^{-3}$. Furthermore, the Al content in the intermediate layer 125 may vary. For example, the Al content may increase in the direction towards the active zone.

FIG. 2A shows a cross-sectional view of the intermediate layer 125 according to further embodiments. According to further embodiments, the intermediate layer 125 may comprise a multiplicity of first and second sub-layers 126, 127 of AlGaN composition, each with a different Al content. For example, the first sub-layers 126 are of $Al_{y'}Ga_{1-y'}N$ composition ($0 \leq y' \leq 1$) having a layer thickness d', and the second sub-layers 127 are of $Al_{y''}Ga_{1-y''}N$ composition ($0 \leq y'' \leq y'$) having a layer thickness d". For example, the average Al content of the intermediate layer 125 is in this case defined as follows:

$$y_{avg}=(y'*d'+y''*d'')/(d'+d''),$$

wherein further: $x*1.05 \leq y_{avg} \leq 1$. The first and second sub-layers 126, 127 are alternately stacked one on top of the other.

For example, the individual layer thicknesses of the first and second sub-layers 126, 127 may each be greater than 1 nm and less than 10 nm. The intermediate layer 125 having a multiplicity of first and second sub-layers 126, 127 forms a superlattice, for example. A total thickness of the intermediate layer 125, which is formed as a superlattice, may be less than 100 nm.

Figure 2B:
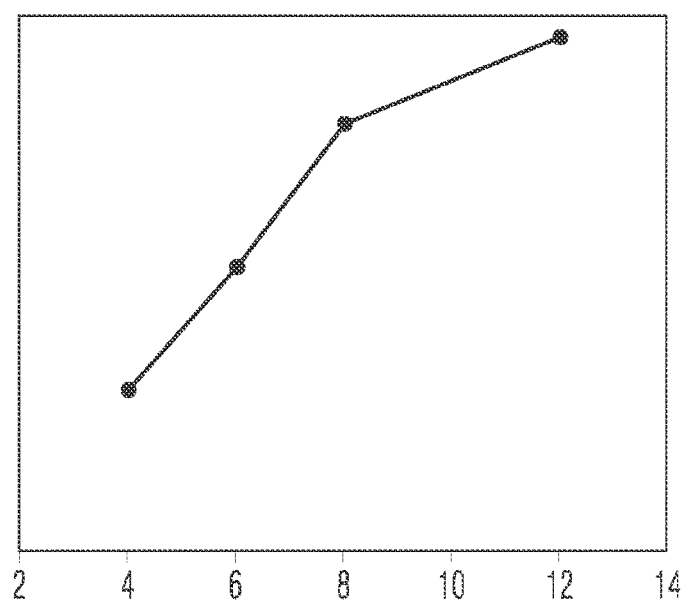
FIG. 2B shows the emitted light power as a function of a layer thickness of the intermediate layer.

FIG. 2B shows a measurement of the output radiation power as a function of the thickness (given in nm) of the intermediate layer 125 under the same operating conditions in each case. As may be seen, the emitted radiation power increases as the layer thickness of the intermediate layer 125 increases.

In general, according to embodiments, the optoelectronic semiconductor components described herein emit electromagnetic radiation in a range from 210 to 360 nm. Depending on the semiconductor layer system used, electromagnetic radiation may also be emitted in other wavelength ranges.

Figure 3A:
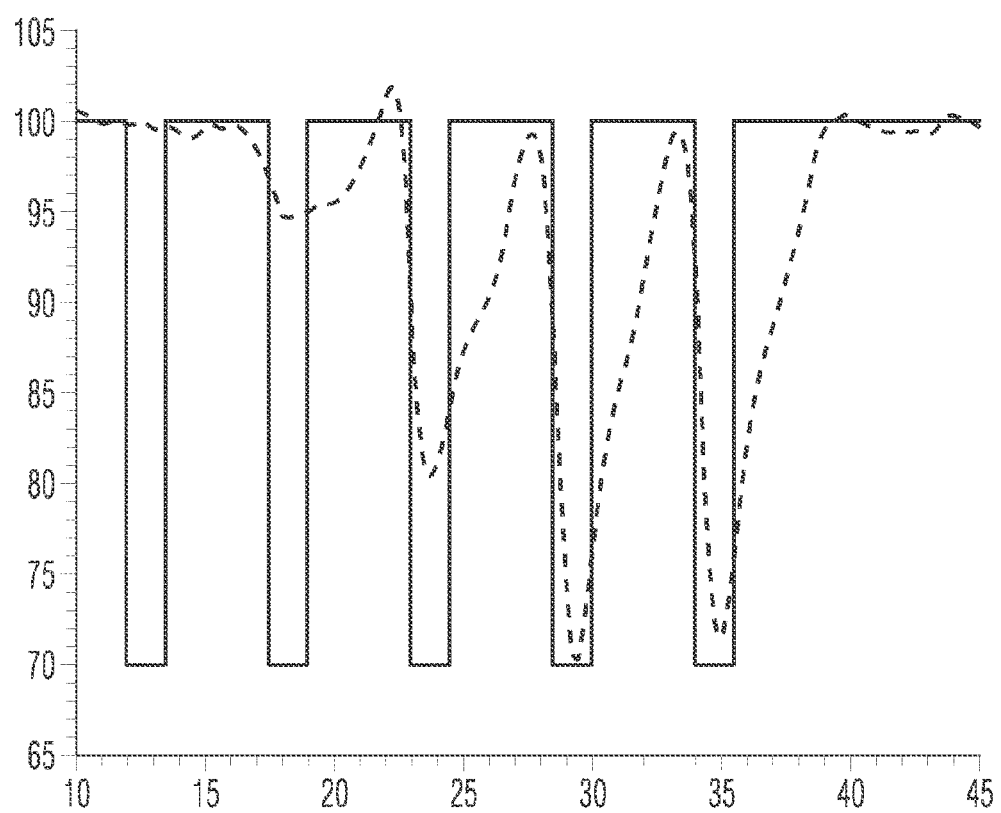
FIG. 3A shows a measurement result of a measurement using the transmission electron microscope.

FIG. 3A shows measurement results of a transmission electron microscopy measurement of the optoelectronic semiconductor component illustrated in FIG. 2A having a quantum well structure 114 which comprises five quantum wells. The quantum wells are each implemented by a different aluminum content in the associated semiconductor layers. The intermediate layer 125 has a layer thickness of 4 nm. The solid line shows the aluminum content intended by setting the deposition parameters as a function of a z coordinate (see FIG. 1) and thus the intended course of the band structure. The dashed line shows the actually measured aluminum content as a function of the z coordinate and thus the course of the band structure according to the quantum wells. As may be seen, the first quantum well, i.e. the quantum well on the left side of the horizontal axis, does not exist. The second and third measured quantum wells comprise a much lower aluminum content than intended.

Figure 3B:
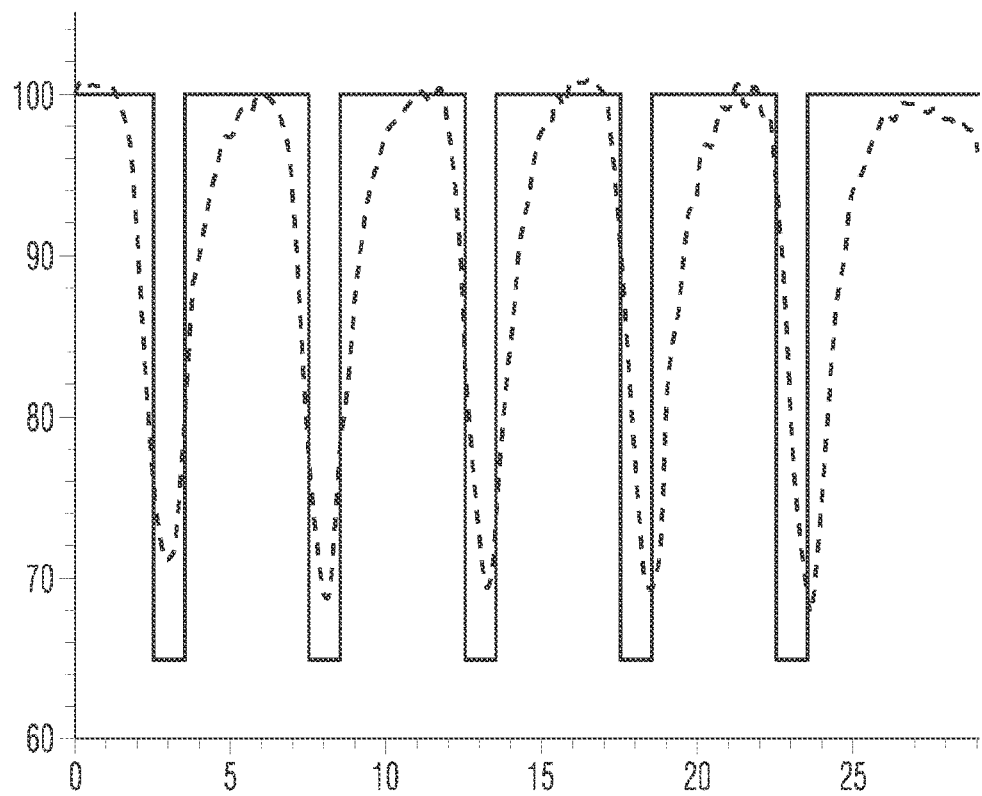
FIG. 3B shows a further result of a measurement using the transmission electron microscope.

FIG. 3B shows a similar measurement for an optoelectronic semiconductor device having a layer thickness of the intermediate layer of 40 nm. As may be seen from FIG. 3B, the measured position (dashed line) of the quantum wells roughly corresponds to the position (solid line) of the quantum wells as provided by setting the deposition parameters. Furthermore, these quantum wells are each formed with a profile roughly similar to that intended.

As may be seen, the quality of the quantum well structure is improved by forming the intermediate layer 125 prior to forming the quantum well structure 114. The quantum well structure 114 comprises a plurality of identical quantum wells having an Al content that corresponds to the intended Al content. At a greater layer thickness of the intermediate layer 115, an improved quality of the active zone is achieved.

FIG. 4A shows a cross-sectional view of an optoelectronic semiconductor component 10 according to further embodiments. The optoelectronic semiconductor component 10 comprises a layer structure similar to that of the semiconductor component shown in FIG. 2A. The active zone 115 comprises a plurality (for example 5) of barrier layers 116 and quantum well layers 113. The quantum well layers each has a composition and layer thickness which is dimensioned such that quantized energy states are present in the quantum well layer 113, which is arranged between two barrier layers. A cover layer 122, made of AlGaN for example, is formed over the uppermost quantum well layer 113. For example, the cover layer 122 may be of the same composition as a barrier layer. For example, the cover layer 122 may have a greater layer thickness than conventional barrier layers in order to avoid surface effects.

Figure 4B:
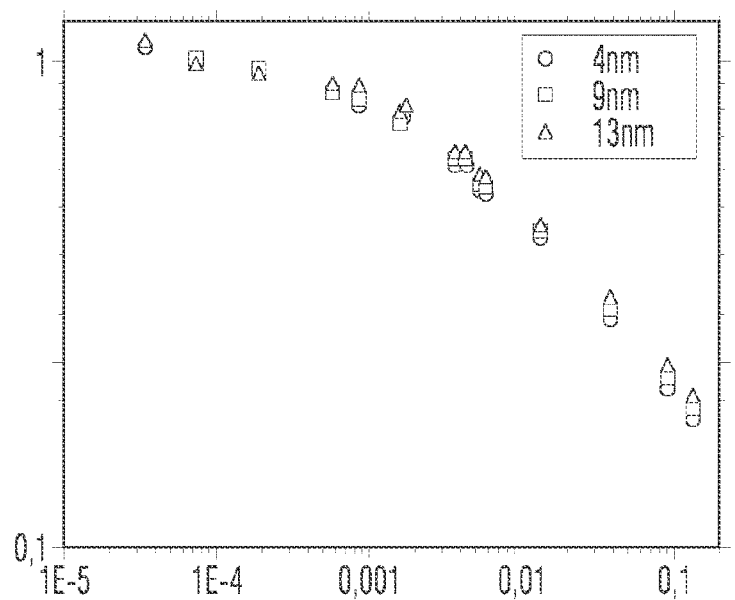
FIG. 4B shows a measurement of the internal quantum efficiency at a temperature of 12 K.
Figure 4C:
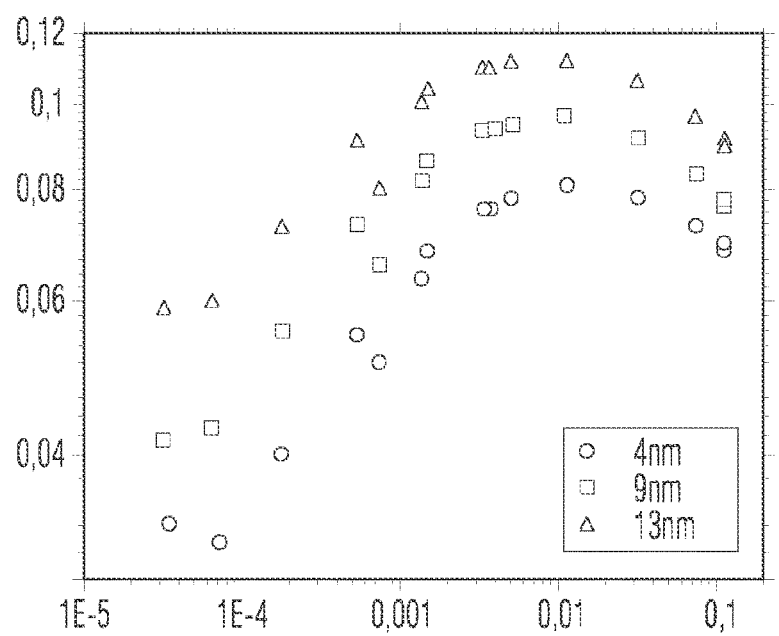
FIG. 4C shows a measurement of the internal quantum efficiency when measured at room temperature.

FIGS. 4B and 4C each show measurement results of the quantum efficiency at 12 K on the one hand (FIG. 4B) and at room temperature (FIG. 4C) on the semiconductor layer structure which is part of the optoelectronic semiconductor component 10 of FIG. 4A. For example, the measurement may be carried out on a layer structure which corresponds to the optoelectronic semiconductor component 10 without first and second contact elements 130, 135. The quantum efficiency is shown as a function of the irradiated laser power. The measurements are each recorded for different layer thicknesses of the intermediate layer 125. As may be seen, at a temperature of 12 K, due to freezing out of the defects and negligible surface recombination, an efficiency occurs that is independent of the layer thickness of the intermediate layer 125. As illustrated in FIG. 4C, the quantum efficiency increases sharply at room temperature as a function of the thickness of the intermediate layer. If the thickness of the intermediate layer increases from 4 nm to 13 nm, the quantum efficiency may be increased by about 30%.

As shown by comparison of FIGS. 4B and 4C, the presence of the intermediate layer 125 may reduce crystal defects. As a result, the crystal quality of the quantum well structure 114 may be improved.

Figure 5A:
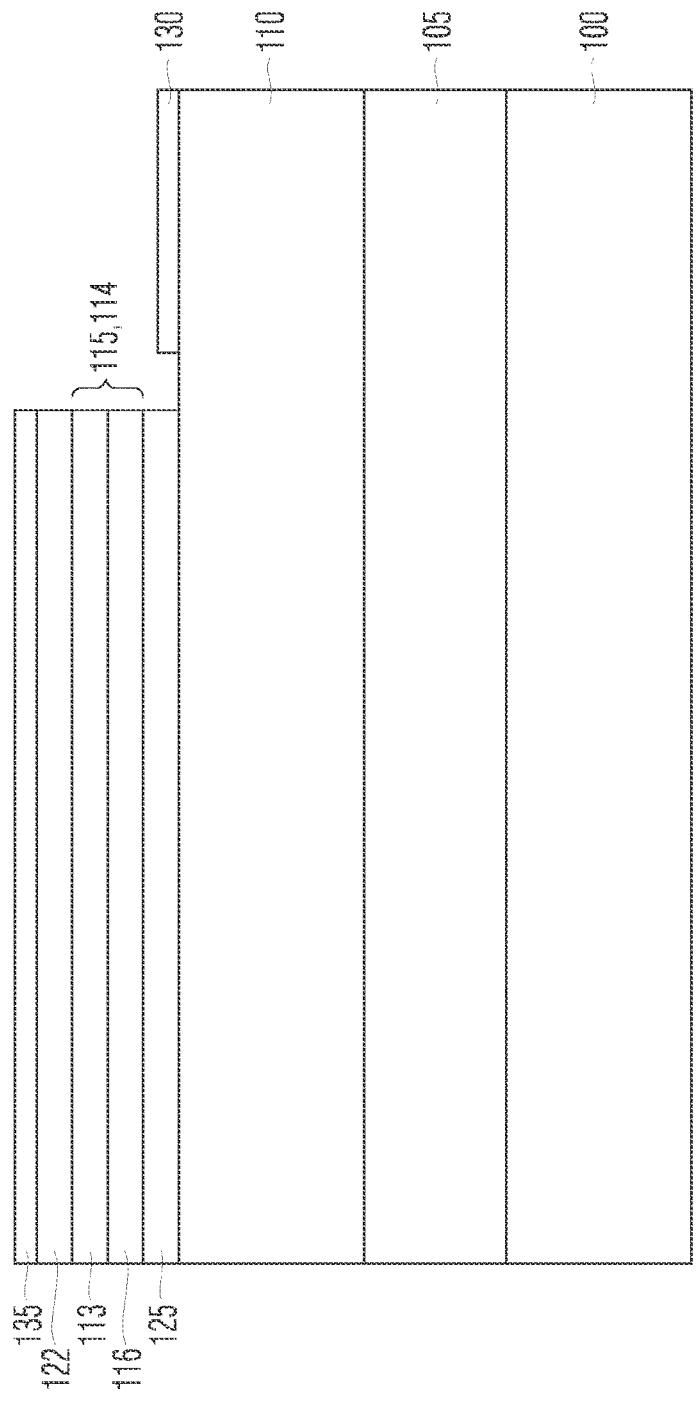
FIG. 5A shows a cross-sectional view of an optoelectronic semiconductor component in accordance with further embodiments.

FIG. 5A shows a cross-sectional view of an optoelectronic semiconductor component in accordance with further embodiments. Deviating from the structure shown in FIG. 4A, the active zone 115 is here formed as a single quantum well structure. In other words, a quantum well layer 113 for forming the quantum well structure 114 is arranged between the barrier layer 116 and the cover layer 122. For example, the cover layer 122 may have a composition similar to that of a barrier layer. The intermediate layer 125 is arranged adjacent to the barrier layer 116.

Figure 5B:
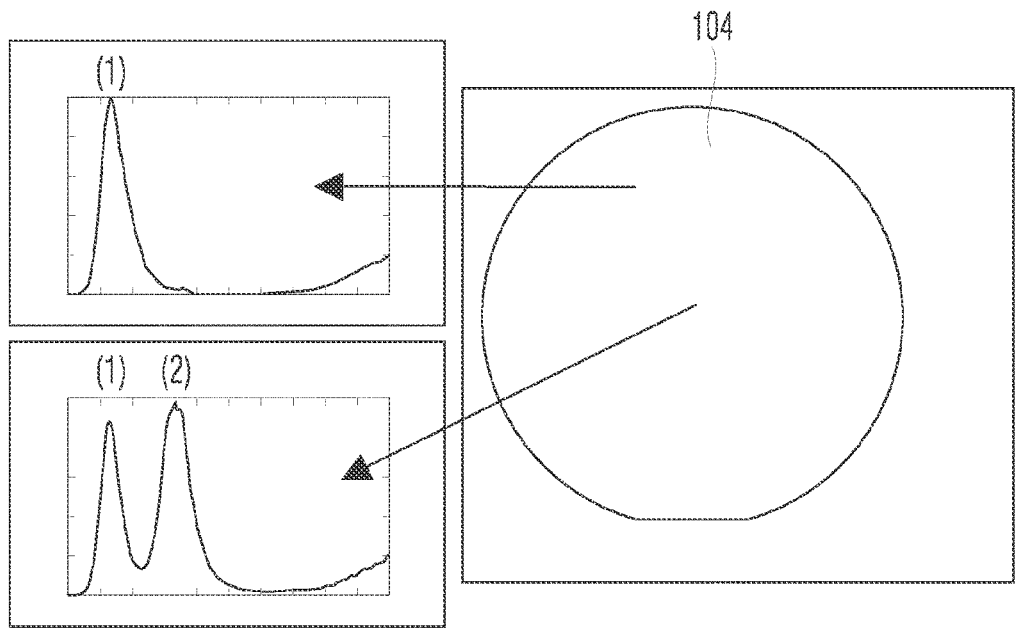
FIGS. 5B and 5C each show results of the measurement of the photoluminescence.
Figure 5C:
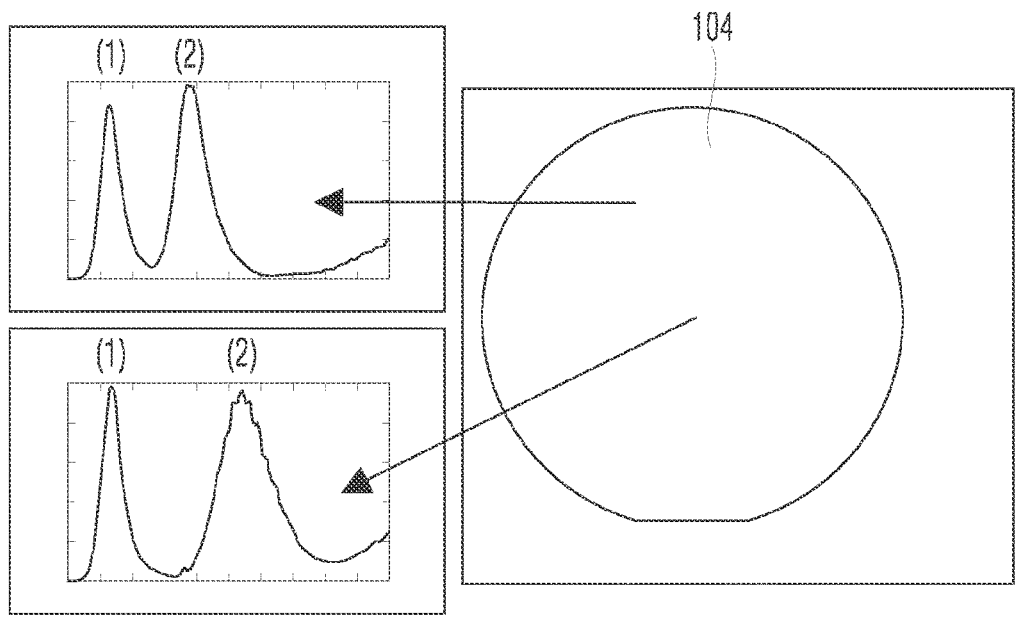

FIGS. 5B and 5C each show photoluminescence measurements on optoelectronic semiconductor components 10. The measurement of FIG. 5C was carried out on an optoelectronic semiconductor component which is, for example, shown in FIG. 5A, having a single quantum well structure. The measurement of FIG. 5B was carried out on an optoelectronic semiconductor component 10 without an intermediate layer 125. The optoelectronic semiconductor components 10 each originate from different positions of a processed wafer 104.

The upper spectrum of FIG. 5B shows a measurement on opto-electronic semiconductor components 10 which are taken from a position opposite the flat point ("anti-flat") of the wafer 104. The lower spectrum of FIG. 5B is taken from the center of the wafer 104. In the upper spectrum, without an intermediate layer, emission takes place only at location (1). This emission is due to the emission in the bulk AlGaN layer. The lower spectrum of FIG. 5B shows emission at location (1) which is due to emission in the bulk AlGaN layer. In addition, emission takes place at location (2). The emission at location (2) is due to emission from the single quantum well structure. The emission wavelength is shorter than would be expected based on the deposition parameters. This means that there is too little gallium in the single quantum well structure.

Again, the upper spectrum of FIG. 5C shows a measurement on optoelectronic semiconductor components 10 which are taken from a position opposite the flat point ("anti-flat") of the wafer 104. Here emission occurs at location (1), which may be attributed to emission in the bulk AlGaN layer. In addition, emission occurs at location (2), which is due to emission from the single quantum well structure. The wavelength is greater than the emission wavelength at location (2) of the lower spectrum of FIG. 5B, indicating that more gallium is incorporated into the quantum well structure. Furthermore, the lower spectrum of FIG. 5C shows a significantly longer emission wavelength of emission (2), which is in the range of the emission wavelength of a multiple quantum well structure. This shows that the single quantum well structure is more homogeneous.

Overall, due to the intermediate layer 125, the quantum wells may thus be formed in a more homogeneous manner, i.e. in relation to a wafer 104. The incorporation of gallium into the quantum well structure is improved, enabling emission at a longer wavelength.

Figure 6:
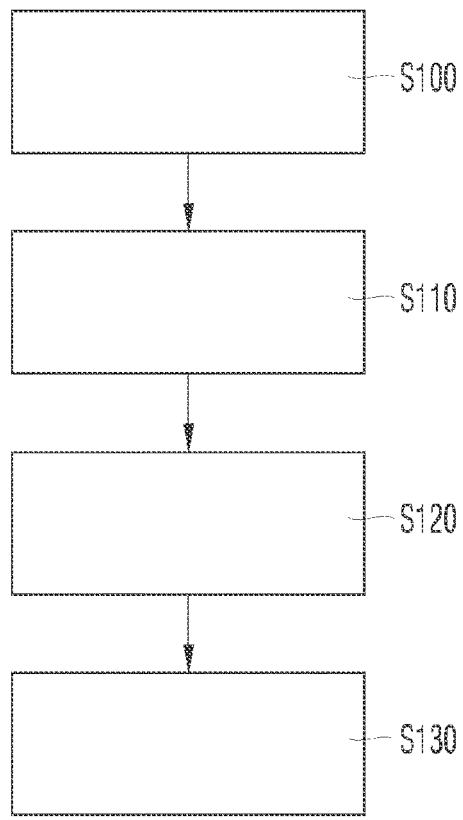
FIG. 6 outlines a method according to embodiments.

FIG. 6 outlines a method according to embodiments. A method for producing an optoelectronic semiconductor component comprises forming (S100) a first semiconductor layer 110 of a first conductivity type, the first semiconductor layer 110 being of $Al_xGa_{1-x}N$ composition. The method further comprises forming (S130) a second semiconductor layer 120 of a second conductivity type and forming (S120) an active zone 115 between the first semiconductor layer no and the second semiconductor layer 120, the active zone 115 comprising a quantum well structure 114. The method further comprises forming (S110) an intermediate layer 125 between the first semiconductor layer 110 and the active zone 115, the intermediate layer 125 comprising a semiconductor material of $Al_yGa_{1-y}N$ composition, with $x*1.05 \leq y \leq 1$.

The semiconductor layers may be formed, for example, by a MOVPE process (metal organic vapor phase epitaxy), other suitable epitaxy processes or a MOCVD process (metal organic chemical vapor deposition). Usually, in order to grow a highly conductive n-AlGaN layer having an aluminum content between 30 and 95%, a high level of metal supersaturation is necessary during deposition in order to reduce the compensation of the metal-vacancy complexes.

In general, the aluminum supersaturation $\sigma$ is defined as $(P/P_0)-1$, where P denotes the partial pressure of aluminum components and $P_0$ denotes the vapor pressure of aluminum components at thermodynamic equilibrium. Gallium supersaturation is defined in a similar manner. When an AlGaN layer is grown, metal supersaturation is defined as the sum of the aluminum and gallium supersaturations.

A high level of metal oversaturation promotes a spiral or helical growth of the respective layers, which ultimately leads to a rough surface.

By forming the intermediate layer 125 after the first semiconductor layer has been formed and prior to forming the active zone, the surface roughness may be reduced. This is achieved by levelling dislocations caused by spiral or helical growth by means of the intermediate layer 125. As a result, a well-defined and therefor sharp transition between the intermediate layer 125 and the active zone 115 may be achieved. This improves the profile of the active zone, in particular the profile of the quantum well structure. Furthermore, the homogeneity of the quantum well structure is improved. As a result, better overall internal quantum efficiency and efficiency of charge carrier injection are achieved.

For example, the intermediate layer is grown at a lower metal supersaturation than the metal supersaturation which is present when the first semiconductor layer is formed. A lower metal supersaturation may be set, for example, by reducing the growth rate, varying the ratio of the constituents of the fifth group compared to the constituents of the third group or by increasing the temperature during growth. For example, the ratio of the constituents of the fifth group may be varied depending on the growth atmosphere. For example, the metal supersaturation for growing the intermediate layer 125 should be at least 10% lower than that for the first semiconductor layer 110. Lower metal supersaturation leads to a higher concentration of metal vacancies. These contain more Ga vacancies because the Al-N bond is stronger than the Ga-N bond. Therefore, a higher aluminum content is required in order to reduce the Ga vacancies and the Ga-vacancy complexes.

According to further embodiments, the intermediate layer 125 may also be implemented as a superlattice structure and may contain a multiplicity of first and second sub-layers 126, 127, as has seen described with reference to FIG. 2A. In this case, an average supersaturation may be set for the deposition of the sub-layers 126, 127 which is lower than that for depositing the first semiconductor layer no. The supersaturation during deposition of the sub-layer 126 or 127 need not necessarily be less than the supersaturation during deposition of the first semiconductor layer no.

According to further embodiments, an aluminum content of the intermediate layer 125 may vary. For example, the aluminum content may increase from the first semiconductor layer to the active zone. Furthermore, the intermediate layer 125 or the intermediate layer stack, which comprises a multiplicity of first and second sub-layers 126, 127, may be doped. For example, the intermediate layer 125 may be doped at the same time, for example at a concentration less than 5E19 cm$^{-3}$, and the aluminum content may increase as the distance from the active zone decreases. As a result, the electron concentration may be increased via polarization doping, as a result of which the charge carrier injection is further improved.

The experimental results confirm that by forming the intermediate layer between the first semiconductor layer and the active region 115, the light output power may be increased. The internal quantum efficiency may be increased by increasing the thickness of the intermediate layer 125. Furthermore, non-radiating charge carrier recombination within the quantum well structure is reduced. Overall, the presence of the intermediate layer 125 leads to a better quality of the quantum well structure 114. In addition, due to the greater homogeneity of the quantum well structure 114, the charge carrier injection efficiency may be increased. As a result, an improved overall external quantum efficiency is achieved.

Figure 7:
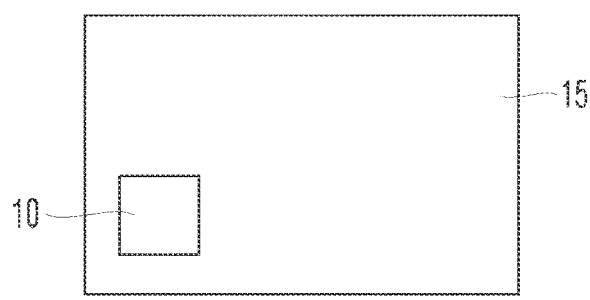
FIG. 7 shows an optoelectronic device according to embodiments.

FIG. 7 shows an optoelectronic device according to embodiments. The optoelectronic device 15 comprises the optoelectronic semiconductor component 10 described herein. For example, the optoelectronic device 15 may be a device for disinfection using UV radiation. For example, the optoelectronic device 15 may be used to disinfect water or air. In addition, the optoelectronic device 15 may be used as a UV measuring device or as a curing device for polymers.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. An optoelectronic semiconductor component comprising:
   a first semiconductor layer of an n-conductivity type, the first semiconductor layer being of $Al_xGa_{1-x}N$ composition, with $0.3 \leq x \leq 0.95$;
   a second semiconductor layer of a p-conductivity type;
   an active zone between the first semiconductor layer and the second semiconductor layer, the active zone comprising a quantum well structure; and
   an intermediate layer between the first semiconductor layer and the active zone,
   wherein the intermediate layer comprises a layer stack comprising first sub-layers of an $Al_{y'}Ga_{1-y'}N$ composition ($0 \leq y' \leq 1$) having a layer thickness d', and second sub-layers of an $Al_{y''}Ga_{1-y''}N$ composition ($0 \leq y'' \leq y'$) having a layer thickness d'', alternately stacked one on top of another, and wherein $x*1.05 \leq y_{avg} \leq 1$ and $y_{avg} = (y'*d'+y''*d'')/(d'+d'')$, and
   wherein the intermediate layer is located directly adjacent to the active zone.

2. The optoelectronic semiconductor component according to claim 1, wherein the intermediate layer has a layer thickness greater than 2 nm.

3. The optoelectronic semiconductor component according to claim 1, wherein the intermediate layer has a layer thickness greater than 8 nm.

4. The optoelectronic semiconductor component according to claim 3, wherein the intermediate layer has a layer thickness greater than 40 nm.

5. The optoelectronic semiconductor component according to claim 1, wherein the intermediate layer has a layer thickness of less than 100 nm.

6. The optoelectronic semiconductor component according to claim 1, wherein the intermediate layer is undoped.

7. The optoelectronic semiconductor component according to claim 1, wherein the intermediate layer is of the n-conductivity type.

8. The optoelectronic semiconductor component according to claim 1, wherein the layer thicknesses of the first and second sub-layers are each greater than 1 nm and less than 10 nm.

9. The optoelectronic semiconductor component according to claim 1, wherein an aluminum content of the intermediate layer decreases with increasing distance from the active zone.

10. A method for producing an optoelectronic semiconductor component, the method comprising:
    forming a first semiconductor layer of an n-conductivity type, the first semiconductor layer being of $Al_xGa_{1-x}N$ composition, with $0.3 \leq x \leq 0.95$;
    forming a second semiconductor layer of a p-conductivity type;

forming an active zone between the first semiconductor layer and the second semiconductor layer, the active zone comprising a quantum well structure; and forming an intermediate layer between the first semiconductor layer and the active zone, wherein the intermediate layer comprises a layer comprises a layer stack comprising first sub-layers of an $Al_{y'}Ga_{1-y'}N$ composition ($0 \leq y' \leq 1$) having a layer thickness d', and second sub-layers of an $Al_{y''}Ga_{1-y''}N$ composition ($0 \leq y'' \leq y'$) having a layer thickness d", alternately stacked one on top of another, and wherein $x*1.05 \leq y_{avg} \leq 1$ and $y_{avg} = (y'*d' + y''*d'')/(d' + d'')$, and wherein the intermediate layer is located directly adjacent to the active zone.

11. The method according to claim 10, wherein the first semiconductor layer is formed from a metal-supersaturated gas mixture.

12. The method according to claim 11, wherein the intermediate layer is formed from a metal-supersaturated gas mixture, and a degree of metal supersaturation for forming the intermediate layer is lower than that for forming the first semiconductor layer.

13. The method according to claim 12, wherein the degree of metal supersaturation for forming the intermediate layer is at least 10% less than that for forming the first semiconductor layer.

* * * * *

UNITED STATES PATENT AND TRADEMARK OFFICE
CERTIFICATE OF CORRECTION

| | | |
|---|---|---|
| PATENT NO. | : 12,170,342 B2 | Page 1 of 1 |
| APPLICATION NO. | : 17/413393 | |
| DATED | : December 17, 2024 | |
| INVENTOR(S) | : Mohammad Tollabi Mazraehno | |

It is certified that error appears in the above-identified patent and that said Letters Patent is hereby corrected as shown below:

In the Claims

In Column 10, in Claim 4, Line 43, after "has" delete "a" and insert -- the --.

In Column 11, in Claim 10, Lines 6-7, after "comprises" delete "a layer comprises".

Signed and Sealed this
Fourth Day of February, 2025

Coke Morgan Stewart
*Acting Director of the United States Patent and Trademark Office*